United States Patent
Wang et al.

(10) Patent No.: US 9,453,948 B2
(45) Date of Patent: Sep. 27, 2016

(54) COLOR FILTER SUBSTRATE, MANUFACTURING METHOD THEREOF AND DISPLAY DEVICE

(71) Applicant: BOE TECHNOLOGY GROUP CO., LTD., Beijing (CN)

(72) Inventors: Dongfang Wang, Beijing (CN); Guangcai Yuan, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 59 days.

(21) Appl. No.: 14/409,118

(22) PCT Filed: Jun. 20, 2014

(86) PCT No.: PCT/CN2014/080457
§ 371 (c)(1),
(2) Date: Dec. 18, 2014

(87) PCT Pub. No.: WO2015/096422
PCT Pub. Date: Jul. 2, 2015

(65) Prior Publication Data
US 2015/0331161 A1    Nov. 19, 2015

(30) Foreign Application Priority Data
Dec. 23, 2013 (CN) .......................... 2013 1 0717971

(51) Int. Cl.
*G02B 5/22* (2006.01)
*G02B 5/20* (2006.01)
(Continued)

(52) U.S. Cl.
CPC ............. *G02B 5/201* (2013.01); *G03F 7/0007* (2013.01); *H01L 51/52* (2013.01); *H01L 51/56* (2013.01); *H01L 27/322* (2013.01)

(58) Field of Classification Search
CPC ........... G02F 1/1335; G02F 1/133514; G02F 1/133345; H01J 9/24; G02B 5/201; G02B 5/22; H01L 51/50; H01L 51/56
USPC .......... 359/885, 890, 891; 349/54, 104, 106, 349/107
See application file for complete search history.

(56) References Cited

U.S. PATENT DOCUMENTS 6,122,027 A * 9/2000 Ogawa .............. G02F 1/133345
349/106
2010/0096655 A1   4/2010 Lee et al.

FOREIGN PATENT DOCUMENTS

| CN | 101344667 A | 1/2009 |
| CN | 101728376 A | 6/2010 |

(Continued)

OTHER PUBLICATIONS

International Search Report, International Preliminary Report on Patentability and Written Opinion of the International Searching Authority of PCT/CN2014/080457 in Chinese, mailed Sep. 29, 2014.

(Continued)

*Primary Examiner* — Euncha Cherry
(74) *Attorney, Agent, or Firm* — Collard & Roe, P.C.

(57) ABSTRACT

A color filter substrate, a manufacturing method thereof and a display device are provided. The color filter substrate includes: a transparent base (1); a color filter layer (2) disposed on the transparent base (1) and at least including a plurality of color filter units; a protective layer (3) disposed on the color filter layer (2); a plurality of auxiliary electrodes (4) disposed on the protective layer (3), with a position of each of the auxiliary electrodes (4) corresponding to a connecting position between two adjacent the color filter units; a black matrix (5) disposed on the auxiliary electrode (4) and partially covering the auxiliary electrode (7); a spacer (6) disposed on the black matrix (5); and a transparent electrode (7) disposed on the spacer (6) and electrically connected with the auxiliary electrode (4) in an area of the auxiliary electrode (4), not covered by the black matrix (5). The color filter substrate, by providing the black matrix on the auxiliary electrodes, can effectively reduce the lateral light leakage caused by the light reflection of the auxiliary electrodes, improve the aperture opening ratio, reduce the thickness of the spacer, and increase the yield. Meanwhile, the function of reducing the number of mask plates can be achieved to reduce the cost.

20 Claims, 2 Drawing Sheets

(51) Int. Cl.
    *G03F 7/00*     (2006.01)
    *H01L 51/52*     (2006.01)
    *H01L 51/56*     (2006.01)
    *H01L 27/32*     (2006.01)

(56) References Cited

FOREIGN PATENT DOCUMENTS

| CN | 103700688 A | 4/2014 |
|---|---|---|
| JP | 2006293385 A | 10/2006 |
| JP | 2008171752 A | 7/2008 |

OTHER PUBLICATIONS

English translation of the International Preliminary Report on Patentability and Written Opinion of the International Searching Authority of PCT/CN2014/080457, issued Jun. 28, 2016.

* cited by examiner

COLOR FILTER SUBSTRATE, MANUFACTURING METHOD THEREOF AND DISPLAY DEVICE

CROSS REFERENCE TO RELATED APPLICATIONS

This application is the National Stage of PCT/CN2014/080457 filed on Jun. 20, 2014, which claims priority under 35 U.S.C. §119 of Chinese Application No. 201310717971.3 filed on Dec. 23, 2013, the disclosure of which is incorporated by reference.

TECHNICAL FIELD

The present disclosure relates to a color filter substrate, a manufacturing method thereof and a display device.

BACKGROUND

Currently, organic light-emitting diodes (OLEDs) gradually dominate the field of display technology due to the characteristics of high mobility, good uniformity and the like, and active matrix organic light-emitting diode (AMOLED) panels, taken as the next generation of display technology, are more favored by users due to the advantages of rapid response speed, high contrast ratio, wider viewing angle and the like.

In actual production, the technology of combining a white organic light-emitting diode (WOLED) and a color filter (CF) substrate is an important development direction of AMOLED. As organic light-emitting materials have the advantages of high utilization rate, low requirement on mask plates of evaporation light-emitting sheets, high aperture opening ratio when a top-emission light-emitting structure is adopted, and the like, the WOLED receives much concern.

A CF substrate known by the inventor generally includes: a substrate, black matrices arranged at intervals on the substrate, a color filter layer disposed between the black matrices and formed of photoresist, a protective layer disposed on the color filter layer, auxiliary electrodes disposed on the protective layer, spacers disposed on the auxiliary electrodes, and transparent electrodes disposed on the spacers.

The OLED light-emitting unit of a WOLED is disposed on an array substrate, and the cathode of the OLED light-emitting unit is electrically connected with a transparent electrode on the CF substrate, so that a supply voltage can be applied to the cathode of the OLED light-emitting unit on the array substrate through the transparent electrode on the CF substrate. The auxiliary electrodes on the CF substrate are usually prepared by metal with good electrical conductivity and have the function of reducing the IR drop of the transparent electrodes.

The WOLED generally adopts a top-emission structure; the OLED light-emitting units on the array substrate are configured to emit light; and the light passes through the cathodes and is emitted from the color filter layer of the CF substrate.

It is found in actual products that the adoption of the means of arranging the spacers on the auxiliary electrodes, as the thickness of the spacers is large, is easy to cause the transparent electrodes to be broken, this leads to a reduced yield and a phenomenon that the auxiliary electrodes emit light, and hence the problems of lateral light leakage, low aperture opening ratio and the like are caused.

SUMMARY

The present disclosure provides a color filter substrate which reduces the lateral light leakage and improves the aperture opening ratio and the yield, a manufacturing method thereof, and a display device including the color filter substrate.

In an aspect, the disclosure provides a color filter substrate, which includes: a transparent base; a color filter layer disposed on the transparent base and at least including a plurality of color filter units; a protective layer disposed on the color filter layer; a plurality of auxiliary electrodes disposed on the protective layer, with a position of each of the auxiliary electrodes corresponding to a connecting position between two adjacent the color filter units; a black matrix disposed on the auxiliary electrode and partially covering the auxiliary electrode; a spacer disposed on the black matrix; and a transparent electrode disposed on the spacer and electrically connected with the auxiliary electrode in an area of the auxiliary electrode, not covered by the black matrix.

In an example, a thickness of the black matrix is from 1 micrometer to 3 micrometers.

In an example, a thickness of the spacer is from 3 micrometers to 9 micrometers.

In an example, a material of the auxiliary electrodes includes metal molybdenum.

In an example, the color filter layer at least includes a plurality of red color filter units, a plurality of green color filter units and a plurality of blue color filter units; and the position of the auxiliary electrode corresponds to a connecting position between two adjacent the color filter units of different colors.

In a further aspect, the disclosure provides a method for manufacturing a color filter substrate, and the method includes: step S1: forming a color filter layer on a transparent base, so that the color filter layer at least includes a plurality of color filter units; step S2: forming a protective layer on the color filter layer; step S3: forming a plurality of auxiliary electrodes on the protective layer, so that a position of each of the auxiliary electrodes corresponds to a connecting position between two adjacent the color filter units; step S4: forming a black matrix on the auxiliary electrode, so that the black matrix partially covers the auxiliary electrode; step S5: forming a spacer on the black matrix; and step S6: forming a transparent electrode on the spacer, so that the transparent electrode is electrically connected with the auxiliary electrode in an area of the auxiliary electrode, not covered by the black matrix.

In an example, the black matrix and the spacer are formed in a same exposure and development process.

In another aspect, the disclosure provides a display device, which includes any one of the above-mentioned color filter substrate.

The present disclosure, by providing the black matrix on the auxiliary electrode, can effectively reduce the lateral light leakage caused by the light reflection of the auxiliary electrode, improve the aperture opening ratio, decrease the thickness of the spacer, and increase the yield. Meanwhile, the function of reducing the number of mask plates can be achieved to reduce the cost.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
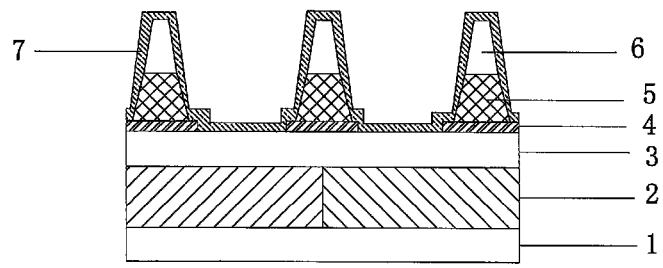
FIG. 1 is a schematic view of a CF substrate provided by an embodiment of the present disclosure.

As illustrated in FIG. 1, the present disclosure provides a CF substrate, which includes a transparent base 1. The transparent base 1 may be made of glass or other materials. A color filter layer 2 is disposed on the transparent base 1, and the color filter layer 2 at least includes a plurality of red color filter units, a plurality of green color filter units and a plurality of blue color filter units. In order to enrich the display color and improve the brightness, the color filter layer 2 may further include color filter units of other colors. The color filter layer may be formed of photoresist.

A protective layer 3 is disposed on the color filter layer 2. On one hand, the protective layer 3 has the function of making the color filter layer 2 planar. On the other hand, the protective layer 3 may also effectively prevent water vapor in the air from entering film layer structures and hence improve the performance stability of the film layer structures.

A plurality of auxiliary electrodes 4 is disposed on the protective layer 3. The position of an auxiliary electrode 4 corresponds to a connecting position between two adjacent color filter units. In one example, the position of the auxiliary electrode 4 corresponds to a connecting position between two adjacent color filter units of different colors. For instance, the auxiliary electrode 4 may be disposed at a connecting position between a red color filter unit and a green color filter unit, may be disposed at a connecting position between a green color filter unit and a blue color filter unit, and may also be disposed at a connecting position between a red color filter unit and a blue color filter unit.

A black matrix 5 is disposed on the auxiliary electrode layer 4 and partially covers the auxiliary electrode 4. For instance, the width of the black matrix 5 may be less than that of the auxiliary electrode 4. The central area of the auxiliary electrode 4 is covered by the black matrix 5, but the peripheral area of the auxiliary electrode 4 is not covered by the black matrix 5.

A spacer 6 is disposed on the black matrix 5, and a transparent electrode 7 is disposed on the spacer 6. The transparent electrode 7 is electrically connected with the auxiliary electrode 4 in the area of the auxiliary electrode 4, not covered by the black matrix 5.

The way of using the black matrix 5 to shield the auxiliary electrode 4 can effectively solve the problem of lateral light leakage caused by the light reflection of the auxiliary electrode; and the width of the black matrix 5 can be reduced to increase the aperture opening ratio. As the black matrix 5 is disposed on the auxiliary electrode 4, the thickness of the spacer 6 can be effectively reduced and the yield can be improved.

The black matrix 5 and the spacer 6 may be formed in a same exposure and development process. In order to reduce the complexity of the process for manufacturing the CF substrate and to improve the process efficiency, the black matrix 5 and the spacer 6 may be formed in a same exposure and development process. Thus, one use of mask plate can be reduced and the cost can be reduced. The process of forming the black matrix 5 and the spacer 6 in a same exposure and development process specifically includes the following steps of: spin-coating of a layer of black-matrix material on the auxiliary electrode 4; spin-coating of a layer of spacer material on the black-matrix material; and performing one exposure and development process, and forming of the black matrix 5 and the spacer 6 in the same exposure and development process. Of course, the black matrix 5 and the spacer 6 may also be respectively formed by using two exposure and development processes.

The thickness of the black matrix 5 is from 1 micrometer to 3 micrometers. For instance, the thickness of the black matrix 5 may be 1 micrometer, 2 micrometers or 3 micrometers.

The thickness of the spacer 6 is from 3 micrometers to 9 micrometers. For instance, the thickness of the spacer 6 may be 3 micrometers, 4 micrometers, 5 micrometers, 6 micrometers, 7 micrometers, 8 micrometers or 9 micrometers.

The auxiliary electrode 4 is made of metal which does not chemically react with an alkali liquid. Thus, the case that the structural layer is corroded by the alkali liquid in a developer can be effectively avoided and the stability of the film layer structure of the auxiliary electrode 4 can be guaranteed. In one example, the material of the auxiliary electrode is metal molybdenum (Mo) or other anti-alkaline-liquid metal.

Figure 3:
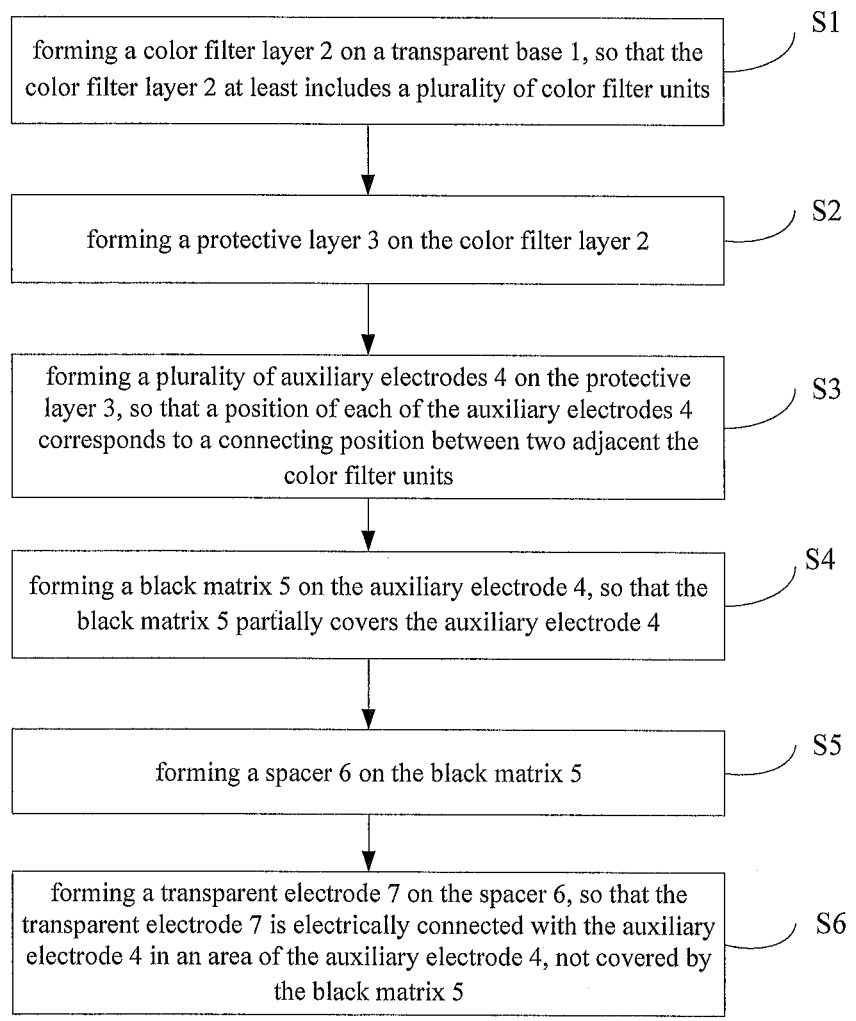
FIG. 3 is a schematic chart illustrating a technological process of a method for manufacturing a CF substrate, provided by an embodiment of the present disclosure.

As illustrated in FIG. 3, the present disclosure further provides a method for manufacturing a CF substrate, and the method specifically includes the following steps.

Step S1: forming a color filter layer 2 on a transparent base 1. In this step, the color filter layer 2 at least includes a plurality of red color filter units, a plurality of green color filter units and a plurality of blue color filter units.

Figure 2A:
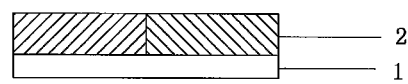
FIGS. 2a to 2e are schematic structural views illustrating the steps in a method for manufacturing a CF substrate, provided by an embodiment of the present disclosure.

Specifically, the color filter layer 2 is formed by using spin-coating process and exposure and development process, and the thickness of the color filter layer 2 is from 1 micrometer to 3 micrometers, as illustrated in FIG. 2a. The red color filter units, the green color filter units and the blue color filter units need be respectively spin-coated with corresponding color filter layers and then subjected to exposure and development. The color filter layer may be formed of photoresist.

Step S2: forming a protective layer 3 on the color filter layer 2.

Figure 2B:
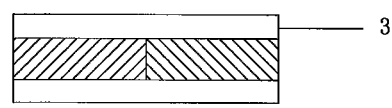

Specifically, the protective layer 3 is formed by using spin-coating, and the thickness of the protective layer 3 is from 2 micrometers to 5 micrometers. The protective layer 3 prepared by spin-coating can have the function of planarization and prevent water vapor in the air from entering other structural layers, as illustrated in FIG. 2b.

Step S3: forming a plurality of auxiliary electrodes 4 on the protective layer 3. In this step, the position of an auxiliary electrode 4 corresponds to a connecting position between two adjacent color filter units. The position of the auxiliary electrode 4 corresponds to a connecting position between two adjacent color filter units of different colors.

Figure 2C:
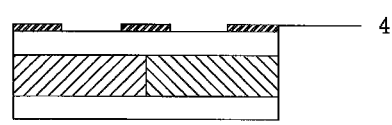

Specifically, metal Mo with the thickness of 20 to 300 nanometers is prepared by sputtering, and the auxiliary electrode layer 4 is formed by using photoresist coating, exposing, developing, etching and stripping processes, as illustrated in FIG. 2c.

Step S4: forming a black matrix 5 on the auxiliary electrode 4. In this step, the black matrix 5 partially covers the auxiliary electrode 4.

Figure 2D:
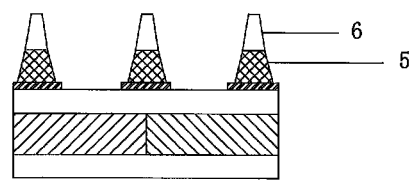

Specifically, the black matrix 5 is formed by using spin-coating process and exposure and development process, and the thickness of the black matrix 5 is from 1 micrometer to 3 micrometers, as illustrated in FIG. 2d.

Step S5: forming a spacer 6 on the black matrix 5, as illustrated in FIG. 2d continuously. Specifically, the spacer 6 is formed of spin-coating process and exposure and development process. The thickness of the spacers 6 is from 3 micrometers to 9 micrometers.

In the steps S4 and S5, patterns of the black matrix 5 and the spacer 6 may be simultaneously formed by using one exposure and development process. For instance, a layer of black-matrix material is spin-coated on the auxiliary electrode 4; a layer of spacer material is spin-coated on the black-matrix material; one exposure and development process is performed; and the black matrix 5 and the spacer 6 are formed in the exposure and development process.

Figure 2E:
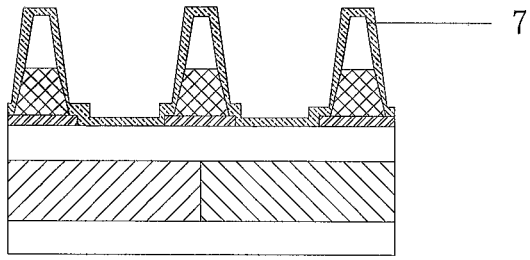

Step S6: forming a transparent electrode 7 on the spacer 6. The transparent electrode 7 covers the black matrix 5 and the spacer 6. The transparent electrode 7 is electrically connected with the auxiliary electrode 4 in an area of the auxiliary electrode 4, not covered by the black matrix 5. The transparent electrode 7 with the thickness of 20 to 150 nanometers is prepared by sputtering, as illustrated in FIG. 2e.

The CF substrate provided by the embodiment can be applied to an AMOLED panel of a top-emission WOLED.

The method for manufacturing a color filter substrate, provided by embodiments of the present disclosure, arranges the black matrix on the auxiliary electrode, and hence can effectively reduce the lateral light leakage, improve the aperture opening ratio, reduce the thickness of the spacer, and improve the yield. Meanwhile, the method can achieve the function of reducing the number of mask plates and reduce the cost.

In addition, the present disclosure further provides a display device, which includes the foregoing CF substrate. The display device may be any product or component with display function, such as a liquid crystal panel, an electronic paper, an OLED panel, a mobile phone, a tablet PC, a TV, a display, a notebook computer, a digital picture frame and a navigator.

The foregoing descriptions are only the preferred embodiments of the present disclosure. It should be noted that various modifications and variations may be also made by those skilled in the art without departing from the technical principle of the present disclosure and shall also fall within the scope of protection of the present disclosure.

The application claims priority to the Chinese Patent Application No. 201310717971.3 submitted on Dec. 23, 2013. The disclosure content of the Chinese Patent Application is incorporated herein as part of the application.

What is claimed is:

1. A color filter substrate, comprising:
   a transparent base;
   a color filter layer disposed on the transparent base, wherein the color filter layer at least comprises a plurality of color filter units;
   a protective layer disposed on the color filter layer;
   a plurality of auxiliary electrodes disposed on the protective layer, wherein a position of each of the auxiliary electrodes corresponds to a connecting position between two adjacent the color filter units;
   a black matrix disposed on the auxiliary electrode, wherein the black matrix partially covers the auxiliary electrode;
   a spacer disposed on the black matrix; and
   a transparent electrode disposed on the spacer, wherein the transparent electrode is electrically connected with the auxiliary electrode in an area of the auxiliary electrode, not covered by the black matrix.

2. The color filter substrate according to claim 1, wherein the color filter layer is formed of photoresist.

3. The color filter substrate according to claim 1, wherein a thickness of the black matrix is from 1 micrometer to 3 micrometers.

4. The color filter substrate according to claim 1, wherein a thickness of the spacer is from 3 micrometers to 9 micrometers.

5. The color filter substrate according to claim 1, wherein a material of the auxiliary electrodes comprises metal molybdenum.

6. The color filter substrate according to claim 1, wherein the color filter layer at least comprises a plurality of red color filter units, a plurality of green color filter units and a plurality of blue color filter units; and the position of the auxiliary electrode corresponds to a connecting position between two adjacent the color filter units of different colors.

7. A method for manufacturing a color filter substrate, comprising:
   step S1: forming a color filter layer on a transparent base, wherein the color filter layer at least comprises a plurality of color filter units;
   step S2: forming a protective layer on the color filter layer;
   step S3: forming a plurality of auxiliary electrodes on the protective layer, wherein a position of each of the auxiliary electrodes corresponds to a connecting position between two adjacent the color filter units;
   step S4: forming a black matrix on the auxiliary electrode, wherein the black matrix partially covers the auxiliary electrode;
   step S5: forming a spacer on the black matrix; and
   step S6: forming a transparent electrode on the spacer, wherein the transparent electrode is electrically connected with the auxiliary electrode in an area of the auxiliary electrode, not covered by the black matrix.

8. The method for manufacturing the color filter substrate according to claim 7, wherein the black matrix and the spacer are formed in a same exposure and development process.

9. The method for manufacturing the color filter substrate according to claim 7, wherein a thickness of the black matrix is from 1 micrometer to 3 micrometers.

10. The method for manufacturing the color filter substrate according to claim 7, wherein a thickness of the spacer is from 3 micrometers to 9 micrometers.

11. The method for manufacturing the color filter substrate according to claim 7, wherein a material of the auxiliary electrodes comprises metal molybdenum.

12. A display device, comprising a color filter substrate, wherein the color filter substrate comprises:
 a transparent base;
 a color filter layer disposed on the transparent base, wherein the color filter layer at least comprises a plurality of color filter units;
 a protective layer disposed on the color filter layer;
 a plurality of auxiliary electrodes disposed on the protective layer, wherein a position of each of the auxiliary electrodes corresponds to a connecting position between two adjacent the color filter units;
 a black matrix disposed on the auxiliary electrode, wherein the black matrix partially covers the auxiliary electrode;
 a spacer disposed on the black matrix; and
 a transparent electrode disposed on the spacer, wherein the transparent electrode is electrically connected with the auxiliary electrode in an area of the auxiliary electrode, not covered by the black matrix.

13. The display device according to claim 12, wherein a thickness of the black matrix is from 1 micrometer to 3 micrometers, and a thickness of the spacer is from 3 micrometers to 9 micrometers.

14. The display device according to claim 12, wherein a material of the auxiliary electrodes comprises metal molybdenum.

15. The display device according to claim 12, wherein the color filter layer at least comprises a plurality of red color filter units, a plurality of green color filter units and a plurality of blue color filter units; and the position of the auxiliary electrode corresponds to a connecting position between two adjacent the color filter units of different colors.

16. The color filter substrate according to claim 2, wherein a thickness of the black matrix is from 1 micrometer to 3 micrometers.

17. The color filter substrate according to claim 2, wherein a thickness of the spacer is from 3 micrometers to 9 micrometers.

18. The color filter substrate according to claim 3, wherein a thickness of the spacer is from 3 micrometers to 9 micrometers.

19. The color filter substrate according to claim 16, wherein a thickness of the spacer is from 3 micrometers to 9 micrometers.

20. The color filter substrate according to claim 2, wherein a material of the auxiliary electrodes comprises metal molybdenum.

* * * * *